(12) United States Patent
Hubacek

(10) Patent No.: US 6,475,336 B1
(45) Date of Patent: Nov. 5, 2002

(54) ELECTROSTATICALLY CLAMPED EDGE RING FOR PLASMA PROCESSING

(75) Inventor: Jerome Hubacek, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 33 days.

(21) Appl. No.: 09/680,515

(22) Filed: Oct. 6, 2000

(51) Int. Cl.[7] .............................. C23C 16/00; C23F 1/02
(52) U.S. Cl. .............. 156/345.51; 118/728; 118/723 E; 361/234; 279/128; 156/345.47
(58) Field of Search .............................. 118/728, 723 R, 118/723 E, 723 ER; 156/345; 279/128; 361/234

(56) References Cited

U.S. PATENT DOCUMENTS

| | | |
|---|---|---|
| 4,340,462 A | 7/1982 | Koch |
| 4,665,463 A | 5/1987 | Ward et al. |
| 4,692,836 A | 9/1987 | Suzuki |
| 4,793,975 A | 12/1988 | Drage |
| 4,948,458 A | 8/1990 | Ogle |
| 5,055,964 A | 10/1991 | Logan et al. |
| 5,160,152 A | 11/1992 | Toraguchi et al. |
| 5,200,232 A | 4/1993 | Tappan et al. |
| 5,238,499 A | 8/1993 | van de Ven et al. |
| 5,262,029 A | 11/1993 | Erskine et al. |
| 5,350,479 A | 9/1994 | Collins et al. |
| 5,494,523 A | 2/1996 | Steger et al. |
| 5,805,408 A | 9/1998 | Maraschin et al. |
| 5,820,723 A | 10/1998 | Benjamin et al. |
| 5,838,529 A | 11/1998 | Shufflebotham et al. |
| 5,986,874 A | 11/1999 | Ross et al. |
| 5,998,932 A | 12/1999 | Lenz |
| 6,013,984 A | 1/2000 | Ellinger et al. |
| 6,022,809 A | 2/2000 | Fan |
| 6,039,836 A | 3/2000 | Dhindsa et al. |
| 6,096,161 A | 8/2000 | Kim et al. |
| 6,117,349 A | 9/2000 | Huang, et al. |

FOREIGN PATENT DOCUMENTS

JP            6-124998       * 5/1994

OTHER PUBLICATIONS

Notification of Transmittal of the International Search Report or the Declaration for International Application No. PCT/US01/30286, filed Sep. 26, 2001.
Written Opinion for PCT/US01/30286 dated Aug. 9, 2002.

* cited by examiner

Primary Examiner—Gregory Mills
Assistant Examiner—Luz L. Alejandro
(74) Attorney, Agent, or Firm—Burns, Doane, Swecker & Mathis, LLP

(57) ABSTRACT

An edge ring clamping assembly wherein an edge ring is supported by an electrostatic edge ring chuck and a method of improving the temperature control of an edge ring in a plasma processing chamber. The edge ring can be made of a conductive material such as silicon or silicon carbide and temperature control of the edge ring can be enhanced by supplying heat transfer gas such as helium between opposed surfaces of the edge ring and the edge ring chuck.

23 Claims, 4 Drawing Sheets

ELECTROSTATICALLY CLAMPED EDGE RING FOR PLASMA PROCESSING

FIELD OF THE INVENTION

The present invention relates to an improved apparatus and method for plasma processing and, in particular, an improved apparatus and method for plasma etching semiconductor substrates.

BACKGROUND OF THE INVENTION

In the field of semiconductor processing, vacuum processing chambers are generally used for etching and chemical vapor deposition (CVD) of materials on substrates by supplying an etching or deposition gas to the vacuum chamber and application of an RF field to the gas to energize the gas into a plasma state. Examples of parallel plate, transformer coupled plasma (TCP™) which is also called inductively coupled plasma (ICP), and electron-cyclotron resonance (ECR) reactors and components thereof are disclosed in commonly owned U.S. Pat. Nos. 4,340,462; 4,948,458; 5,200,232 and 5,820,723. U.S. Pat. No. 4,793,975 also discloses a parallel plate plasma reactor.

During processing of semiconductor substrates, the substrates are typically held in place within the vacuum chamber on substrate holders by mechanical clamps and electrostatic clamps (ESC). Examples of such clamping systems and components thereof can be found in commonly owned U.S. Pat. Nos. 5,262,029 and 5,838,529. An example of a monopolar chuck can be found in U.S. Pat. No. 4,665,463 and examples of bipolar chucks can be found in U.S. Pat. Nos. 4,692,836 and 5,055,964. In order to cool the substrates, cooling gas such as helium can be supplied to the backside of the substrate. Examples of such cooling can be found in U.S. Pat. Nos. 5,160,152; 5,238,499; and 5,350,479.

Substrate supports can include consumable (sacrificial) edge rings around the substrate for purposes of confining plasma to the area above the wafer and/or protect the ESC from erosion by the plasma. For instance, an edge ring arrangement is described in commonly owned U.S. Pat. Nos. 5,805,408; 5,998,932; 6,013,984; and 6,039,836. Other examples of edge ring arrangements can be found in U.S. Pat. Nos. 5,494,523; 5,986,874; 6,022,809; 6,096,161; and 6,117,349.

In plasma processing arrangements wherein a sacrificial ring surrounds a wafer, it would be desirable to improve the thermal contact between the ring and an underlying portion of the substrate support. By improving thermal coupling, improved temperature control of the ring could be realized and the clearances required between the ring and the wafer could be reduced. It would also be desirable if the RF impedance path from the baseplate to the plasma in the area above the wafer could be more closely matched to the RF impedance path from the baseplate to the plasma in the area of the edge ring in order to improve plasma uniformity near the edge of the wafer.

SUMMARY OF THE INVENTION

The present invention provides an edge ring clamping assembly adapted to surround a substrate support in a plasma reaction chamber. The edge ring clamping assembly includes a member having an annular support surface and an electrostatic edge ring chuck on the support surface. According to one embodiment, the edge ring chuck comprises an outer portion of a ceramic body mounted on the substrate support and the ceramic body includes an electrostatic wafer chuck located radially inward of the edge ring chuck. According to another embodiment, an axially extending groove is located in the annular support surface and the groove is adapted to receive a mating projection of an edge ring clamped on the edge ring chuck. Optionally, at least one gas passage extends through the member and the edge ring chuck such that a heat transfer gas can be supplied to an exposed surface of the edge ring chuck. The edge ring chuck can comprise a bipolar chuck and/or an edge ring of electrically conductive material can be clamped to the member by the edge ring chuck.

The present invention also provides a plasma reaction chamber comprising a substrate support on which a wafer to be processed can be mounted and an electrostatic edge ring chuck on which an edge ring can be supported during processing. In one embodiment, the substrate support comprises a temperature controlled electrode adapted to maintain the edge ring below a threshold temperature by heat conduction from the edge ring to the substrate support. In another embodiment, the edge ring includes a recess on an inside edge of an upper surface thereof and the recess is adapted to fit beneath a wafer mounted on the substrate support with a clearance gap between the edge ring and the wafer of no more than about 0.003 inch. The substrate support can comprise an RF driven electrode and/or the plasma reaction chamber can comprise a parallel plate reactor such as an etch chamber having an upper electrode facing the baseplate.

The present invention also provides a method of treating a semiconductor substrate such as a wafer in a plasma chamber wherein the plasma chamber comprises a substrate support, an electrostatic wafer chuck on an upper surface of the substrate support and an electrostatic edge ring chuck on which an edge ring can be supported. In a preferred embodiment, the method comprises the steps of electrostatically clamping a wafer to the wafer chuck, electrostatically clamping an edge ring to the edge ring chuck, supplying a process gas to the interior of the plasma chamber, energizing the process gas into a plasma state, and processing the wafer with the plasma. During the process, a heat transfer gas can be supplied to an interface between the edge ring and the edge ring clamp to maintain the temperature of the edge ring below a threshold temperature.

DETAILED DESCRIPTION OF THE PREFERRED EMBODIMENTS

The invention provides an improved substrate support arrangement for a plasma reactor wherein a sacrificial edge ring surrounds a semiconductor substrate such as a silicon wafer. In arrangements wherein an edge ring merely rests on the underlying substrate support and is held in place by gravity and/or frictional engagement with the substrate support, the ring can become very hot during plasma processing of the substrate. In the case where the substrate overlies a portion of the edge ring, the thermal expansion of the edge ring during plasma processing makes it necessary to provide sufficient clearance between the edge ring and the substrate so that the hot edge ring does not lift the substrate off of the substrate support. According to the present invention, thermal coupling from the edge ring to the substrate support is improved with the result that plasma erosion of the edge ring can be reduced and/or the clearance gap between the edge ring and the wafer can be reduced to thereby minimize erosion of the wafer chuck by plasma penetrating the gap between the edge ring and the wafer chuck.

The edge ring assembly according to the present invention can be designed in a manner which achieves more uniform plasma processing of semiconductor substrates. The improved uniformity can be achieved by providing an RF impedance path which is similar at the center and edge of a substrate undergoing plasma processing. The RF impedance path can be manipulated by choice of materials for the wafer chuck and edge ring chuck according to the present invention. As is known, an RF bias can be applied to a substrate undergoing plasma processing by a powered electrode underlying the wafer chuck. However, because the RF impedance path from the powered electrode through the wafer chuck and substrate to the plasma can be different than the RF impedance path from an outer portion of the powered electrode to the plasma, a nonuniform plasma density which results at the edge of the substrate can lead to nonuniform processing of the substrate. The invention overcomes this using materials for the edge ring chuck and edge ring which provide a more uniform RF impedance path at the center and edge of the substrate so as to provide more uniformity of the plasma density across the substrate.

The invention can be implemented in various plasma reactors such as parallel plate, inductively coupled, ECR, helicon, or other type of plasma reaction chamber. For purposes of explanation, the invention is described in the following with reference to a parallel plate type plasma reaction chamber especially suited for plasma etching. However, the invention is also applicable to other chamber designs and/or plasma processing operations other than etching.

Figure 1:
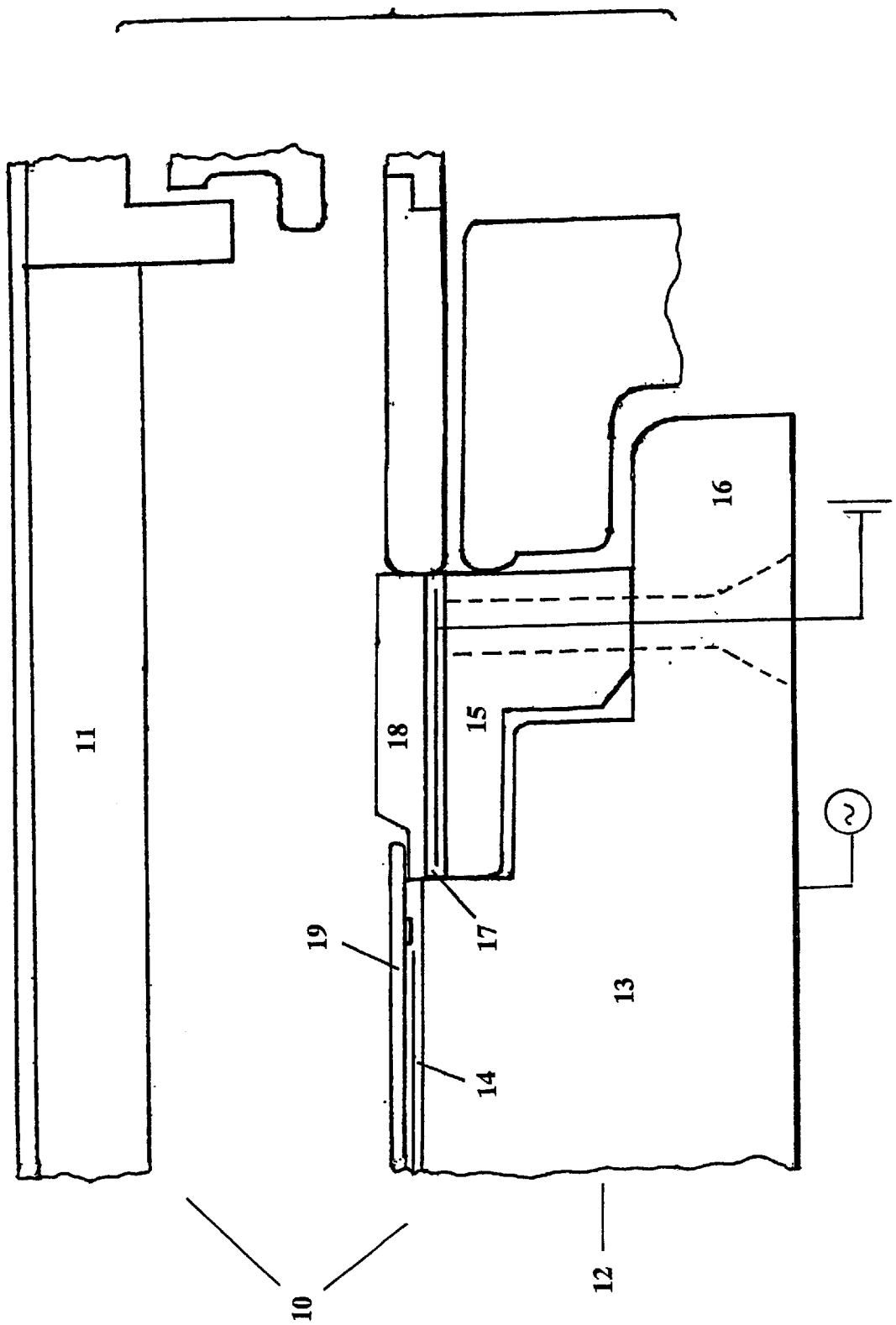
FIG. 1 is a partial view of a parallel plate plasma processing apparatus according to the present invention.

FIG. 1 shows a parallel plate plasma reaction chamber 10 according to one embodiment the invention. The apparatus comprises an upper electrode 11 and a lower electrode assembly 12. The lower electrode assembly comprises a baseplate 13 and an electrostatic wafer chuck 14 located on an upper surface thereof. A coupling ring 15 rests on a flange 16 of the baseplate. The coupling ring 15 has an edge ring chuck 17 located on an upper surface thereof. An edge ring 18 is supported on the exposed upper surface of the edge ring chuck 17. A wafer 19 is mounted on the wafer chuck 14 such as to overlap the wafer chuck and the inner surface of the edge ring 18.

The wafer 19 overlaps the edge of the wafer chuck so that the exposure of the edge of the wafer chuck 14 to the ions/reactive species in the plasma is reduced. Otherwise, exposure of the wafer chuck 14 to the plasma can cause erosion of the wafer chuck and necessitate replacement of the entire substrate support assembly or at least the wafer chuck portion thereof thus causing production delay and expense associated with the repair. The edge ring 18 is intended to be a consumable or replaceable part which protects the wafer chuck from plasma erosion. In order to further protect the wafer chuck, the wafer 19 overhangs the wafer chuck 14 and a portion of the edge ring 18 extends under the edge of the wafer 19, e.g., the wafer 19 can overhang the edge of the wafer chuck 14 by 1 to 2 mm. Further, while the top of the edge ring 18 is positioned as closely as possible to the underside of the wafer 19, thermal expansion of the edge ring during processing of a wafer makes it necessary to provide a clearance gap between the underside of the wafer and the edge ring large enough to allow for the thermal expansion of the edge ring and avoid the expanded edge ring from lifting the wafer off of the wafer chuck during the process.

Figure 2:
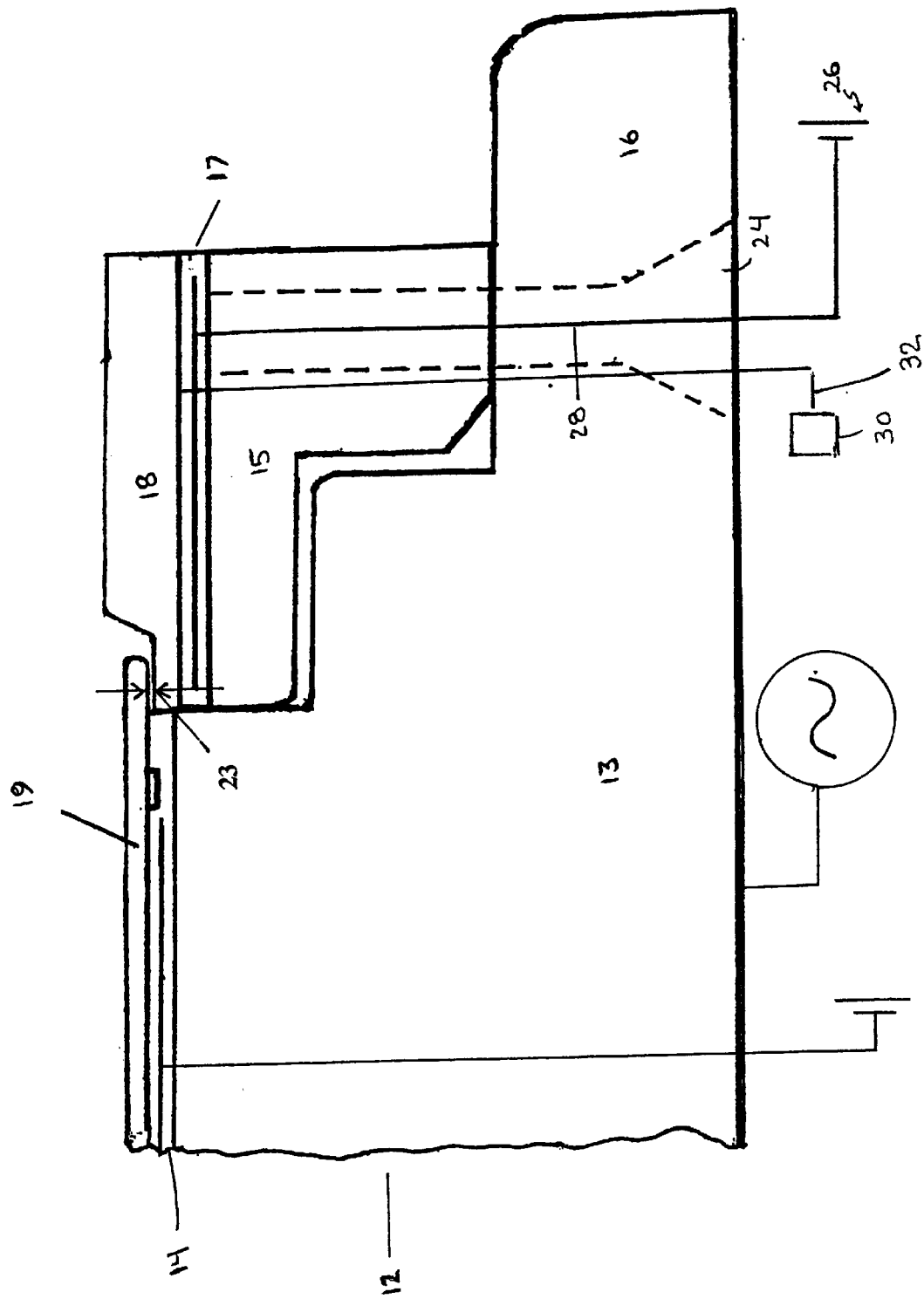
FIG. 2 is a partial view of a plasma chamber comprising an edge ring chuck mounted on a coupling ring according to one embodiment of the present invention.

FIG. 2 is an enlarged view of the lower electrode assembly 12 of FIG. 1. The wafer 19 is shown overlapping the edge ring 18 to form a gap or clearance 23 between the wafer backside and the edge ring 18. The inner edge of the edge ring 18 contacts or is located close to the outer edge of the wafer chuck 14 so as to maintain the edge ring 18 in a desired position with respect to the wafer 19. The edge ring chuck 17 can extend completely across the coupling ring 15 or the edge ring chuck 17 can be located in a recess in the upper surface of the coupling ring 15. The coupling ring 15 can be supported on the base plate 13 with or without mechanical or adhesive fastening such as a plurality of bolts 24. The edge ring chuck 17, which can be a monopolar or bipolar chuck, can be supplied with DC power by a suitable power supply arrangement such as a DC power supply 26 using an electrical connection, e.g., lead line 28 extending through a passage in one of the bolts 24. In order to improve thermal transfer between the edge ring 18 and the base plate 13, a heat transfer gas such as He or process gas from a gas source 30 can be supplied via gas passage 32 to the interface between the coupling ring 15 and the base plate 13 and/or between the edge ring chuck 17 and the edge ring 18. The gas passage 32 can extend through the base plate 13 and coupling ring 15 at one or more locations spaced around the base plate 13, e.g., extending through passages in the bolts 28.

Figure 3:
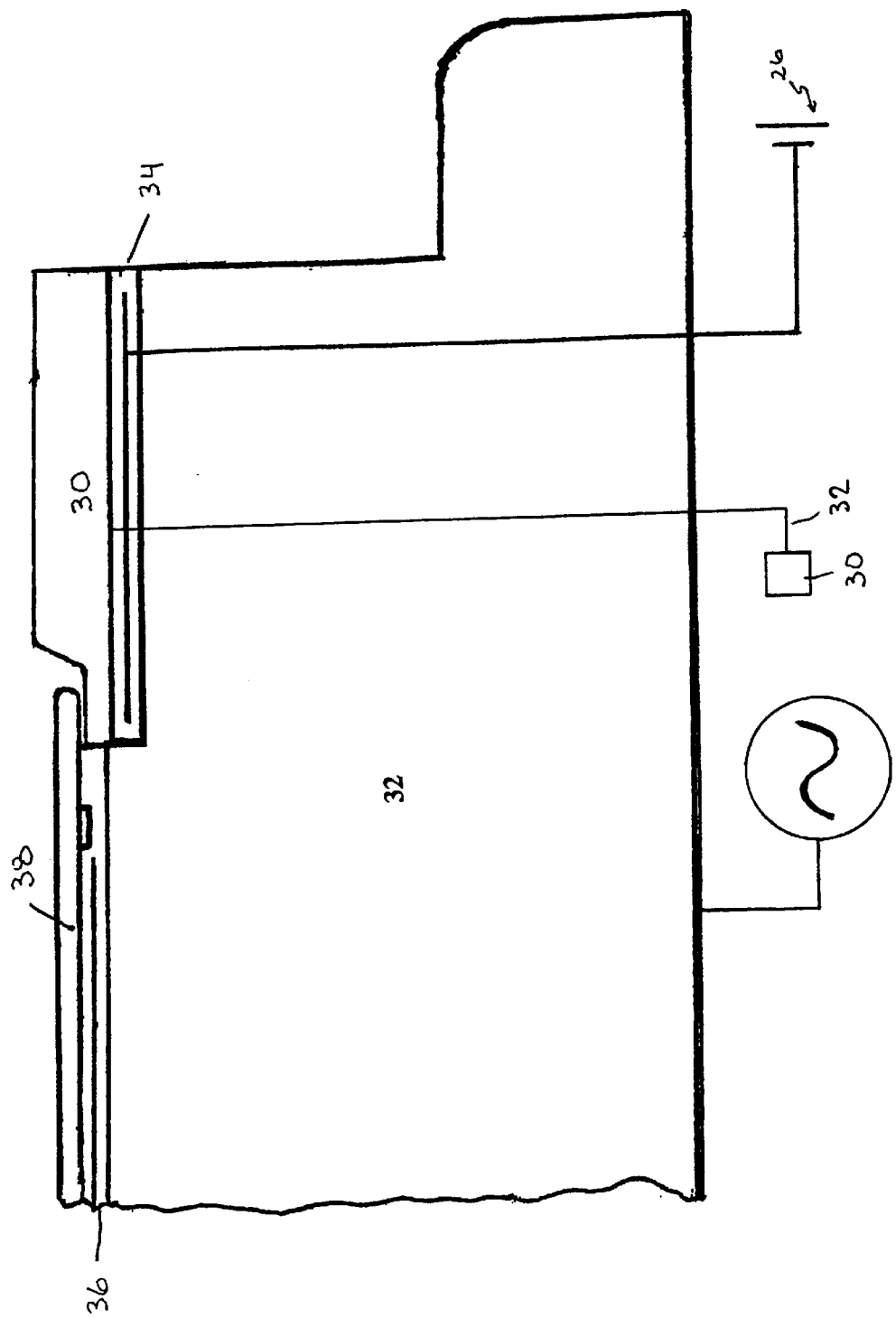
FIG. 3 is a partial view of a plasma chamber comprising an edge ring chuck mounted on a baseplate according to another embodiment of the present invention.
Figure 4:
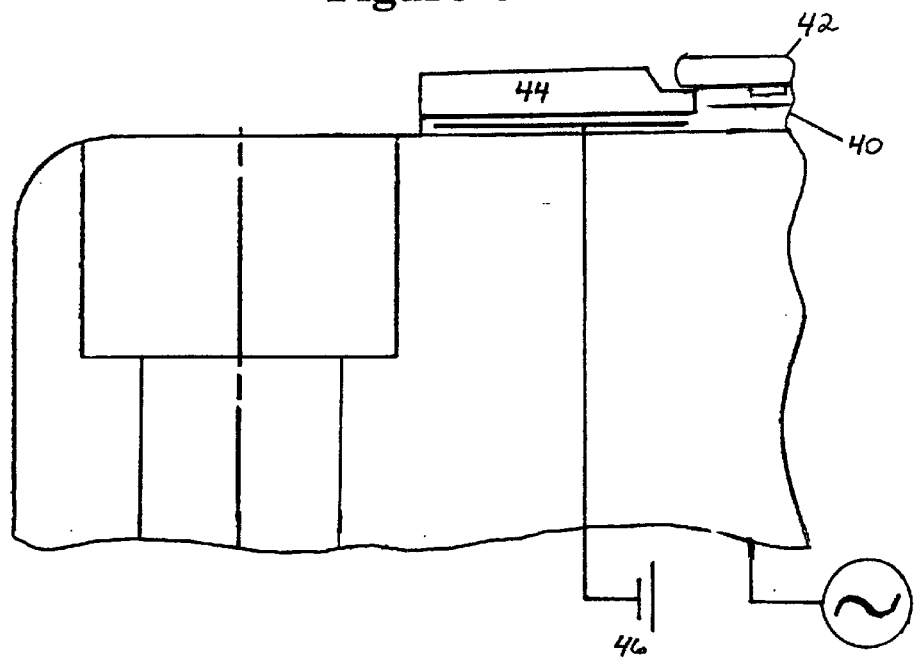
FIG. 4 is a partial view of a plasma chamber according to the invention comprising an integral edge ring/wafer chuck mounted on a baseplate.
Figure 5:
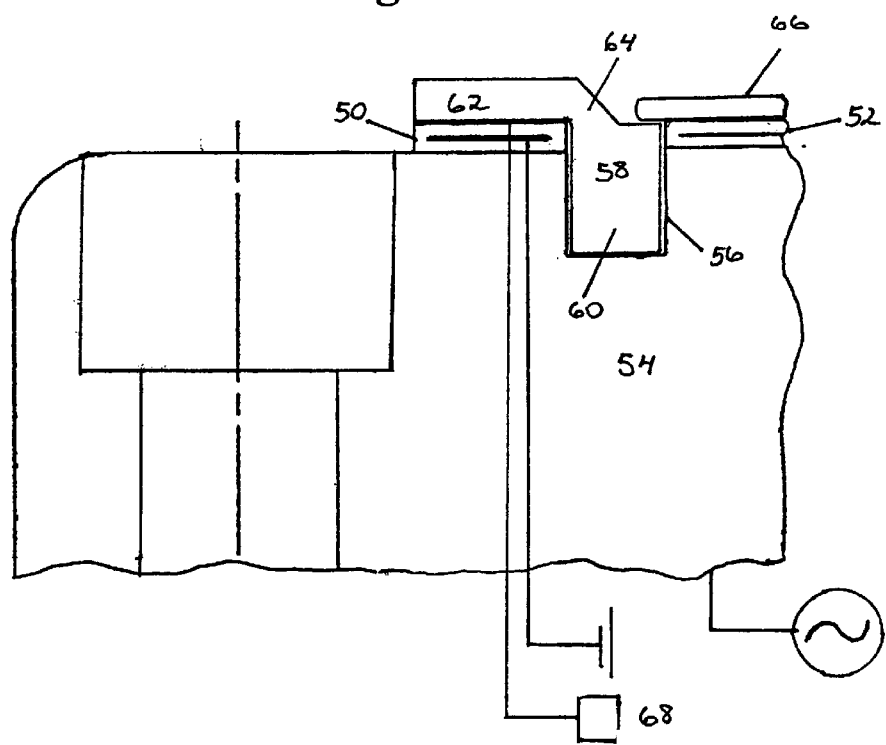
FIG. 5 is a partial view of a plasma chamber according to another embodiment of the invention comprising an edge ring adapted to fit into a groove in the baseplate between the wafer and edge ring chucks.

FIGS. 3–5 show variations of how the edge ring chuck can be mounted on the base plate rather than on a coupling ring. As shown in FIG. 3, an edge ring chuck 34 is supported on an outer portion of the baseplate 32 and a wafer chuck 36 is supported on a central portion of the baseplate 32 such that the upper surface of the chuck 36 is vertically higher than the upper surface of the chuck 34. To promote heat transfer from the chuck 34 to the baseplate 32, a gas supply 30 can supply a heat transfer gas through one or more gas passages 32 into an interface between the edge ring chuck 34 and the edge ring 30. If desired, one or more depressions (which can be filled with the heat transfer gas) can be provided in the lower surface of the edge ring and/or the opposed upper surface of the edge ring chuck 34 to enhance the cooling of the edge ring. Also, by using similar materials for the edge ring chuck and the wafer chuck, the RF impedance from the baseplate 32 through the chuck 36 and wafer 38 to the plasma above the wafer can be made similar to the RF impedance path from the baseplate 32 through the chuck 34 and edge ring 30.

In FIG. 4, the edge ring chuck and wafer chuck comprises an integral part 40 mounted on the substrate support. As shown, a peripheral portion of the part 40 is recessed relative to a central portion of the part 40 such that an edge ring 44 fits in the recess and a wafer 42 overlies an inner portion of the edge ring 44. As in the previous embodiments, the edge ring includes an inner flange which fits beneath the outer edge of the wafer. Although the edge ring chuck and the wafer chuck could comprise a single monopolar or bipolar electrode, it is preferable for the edge ring to be operated separately from the wafer chuck. Thus, the edge ring chuck can be supplied power by a DC power supply 46 and the wafer chuck can be supplied power by another power supply (not shown).

FIG. 5 shows an arrangement wherein the edge ring includes a portion which fits within a groove in the substrate support. As shown, an edge ring chuck 50 and a wafer chuck 52 are mounted directly on a baseplate 54 such that the upper surfaces of the edge ring and wafer chucks 50, 52 are approximately coplanar. An axially extending groove 56 is provided in the baseplate 54 at a location which separates the edge ring and wafer chucks 50, 52. The edge ring 58 includes a mating projection 60 configured to fit in the groove 56 in the baseplate 54 and a radially extending portion 62 of the edge ring 58 overlies the edge ring chuck 50. The projection 60 is preferable sized to allow for thermal expansion of the edge ring 58 during plasma processing of a wafer 66. The axially and radially extending portions 60,62 of the edge ring 58 are connected by a transition portion 64 which is configured to allow the wafer 66 to overlap an inner surface of the edge ring 58. As with the other embodiments, the underside of the edge ring 58 can be supplied with a heat transfer gas 68. The interfaces between the axially extending portion 60 of the edge ring 58 and the groove 56 in the baseplate 54 can also be provided with heat transfer gas to further improve thermal coupling of the baseplate and edge ring 58. Further, by making the edge ring chuck 50 and wafer chuck 52 of similar materials, the RF impedance path can be made more similar from the center to edge of the wafer.

Better temperature control of the edge ring allows for process advantages. For example, controlling the temperature of the edge ring can reduce the amount of thermal expansion of the edge ring during processing of a wafer and thereby allow for smaller clearances between the top of the edge ring and the underside of the wafer. Compared to the case where the edge ring merely rests on the underlying coupling ring or substrate support, when using the edge ring chuck according to the invention the clearance between the backside of the wafer and the edge ring can be reduced by 50% or more, e.g., the clearance can be reduced from 0.005–0.006 inch to 0.002–0.003 inch. The reduced clearance which can be realized according to the invention provides more protection to the wafer chuck, i.e., more plasma is prevented from entering the clearance gap and attacking the wafer chuck with the smaller clearance gap. Further, the tendency of particles generated during plasma processing to build up on the edge of the wafer chuck can be reduced. As is known, particle build-up can prevent the wafer from uniformly contacting the wafer chuck resulting in diminished clamping capacity and/or particle contamination of the wafer. Another advantage is that by lowering the temperature of the edge ring during processing it may be possible to reduce the rate of erosion of the edge ring, i.e., reducing the temperature of the edge ring can reduce the chemical reaction rates of the edge ring material with the ions/chemical species in the plasma.

The edge ring arrangement according to the invention can improve plasma etch performance. For example, improvements in etch uniformity can result from better thermal management at the wafer edge and/or improvement in RF impedance path matching. With regard to temperature at the wafer edge, if the wafer and edge ring are maintained at similar temperatures during processing, the etch characteristics can be made more uniform from center to edge of the wafer. With regard to RF impedance path matching, using an edge ring chuck made of the same materials as the wafer chuck minimizes disruption to the RF impedance path from the bottom electrode to the plasma from center to edge of the wafer. This effect can be further improved by selecting a material for the edge ring which is similar in characteristics to the wafer undergoing processing, e.g., if a silicon wafer is being processed the edge ring can be comprised entirely of silicon so that the RF impedance path from the bottom electrode through the edge ring can be made more similar to the impedance path from the bottom electrode through the wafer. Thus, the current density in the plasma region adjacent the wafer and edge ring surfaces can be made more uniform and thereby improve etch uniformity.

The edge ring can be made from any suitable material with electrically conductive material such as silicon and silicon carbide being preferred. Because the edge ring is exposed directly to the plasma, it is desirable to use highly pure materials such as single crystal silicon, polycrystalline silicon, CVD silicon carbide, or the like. Other materials can include quartz, aluminum oxide, aluminum nitride, silicon nitride, etc. In order to achieve clamping of the edge ring it may be advantageous in the case of nonconductive materials to include an electrically conductive insert in the edge ring as disclosed in commonly owned U.S. Pat. No. 6,039,836, the disclosure of which is hereby incorporated by reference.

The edge ring chuck and the wafer chuck can be made from any suitable materials such as those used in conventional electrostatic wafer chucks including anodized aluminum, polyimides and ceramic materials. The edge ring chuck (and optionally the wafer chuck) can be made from a ceramic material such as alumina or aluminum nitride with the electrode or electrodes being made from any suitable conductive material. With sintered ceramic chucks, the electrodes are preferably made from a refractory metal such as tungsten or molybdenum which can withstand the high temperatures encountered during sintering of the chuck, e.g., the edge ring chuck can be made by a sintering process such as sandwiching a refractory metal electrode (tungsten ink) between two ceramic green sheets and firing to form the sintered structure. The edge ring chuck can be of the coulombic (fully insulating) or Johnsen-Rahbeck type (semi-conducting). The edge ring chuck may be secured to the coupling ring or substrate support using any of the methods and materials known in the art for securing wafer chucks. The edge ring chuck, for example, may be secured using a high temperature polymer adhesive such as a silicone adhesive.

Although the present invention has been described in connection with preferred embodiments thereof, it will be appreciated by those skilled in the art that additions, deletions, modifications, and substitutions not specifically described can be made without departing from the spirit and scope of the invention as defined in the appended claims.

What is claimed is:

1. An edge ring clamping assembly adapted to surround a substrate support in a plasma reaction chamber, the edge ring clamping assembly comprising:

a member having an annular support surface;

an electrostatic edge ring chuck on the annular support surface; and an edge ring on the edge ring chuck dimensioned so as to provide a clearance gap between a lower surface of a substrate located on the substrate support and an upper surface of the edge ring.

2. The edge ring clamping assembly of claim 1, wherein the edge ring chuck comprises an outer portion of a ceramic body mounted on the substrate support, the ceramic body including an electrostatic substrate chuck located radially inward of the edge ring chuck.

3. The edge ring clamping assembly of claim 1, wherein a groove is located in the annular support surface, the groove being adapted to receive a mating projection of the edge ring clamped on the edge ring chuck.

4. The edge ring clamping assembly of claim 1, further comprising at least one gas passage extending through the member and the edge ring chuck, the gas passage being adapted to supply a heat transfer gas to an exposed surface of the edge ring chuck.

5. The edge ring clamping assembly of claim 1, wherein the edge ring chuck comprises a bipolar chuck.

6. A plasma reaction chamber, comprising:
   an edge ring clamping assembly adapted to surround a substrate support in the plasma reaction chamber, the edge ring clamping assembly comprising:
   a member having an annular support surface;
   an electrostatic edge ring chuck on the annular support surface; and
   an edge ring on the edge ring chuck dimensioned so as to provide a clearance gap between a lower surface of a substrate located on the substrate support and an upper surface of the edge ring.

7. The plasma chamber of claim 6, wherein the substrate support comprises a baseplate having an electrostatic substrate chuck on an upper surface thereof.

8. The plasma chamber of claim 7, wherein an upper surface of the substrate chuck is higher in a vertical direction with respect to an upper ring chuck.

9. The plasma chamber of claim 7, wherein the substrate support includes a groove between the electrostatic substrate chuck and the edge ring chuck, the groove being adapted to receive a mating projection of the edge ring clamped on the edge ring chuck.

10. The plasma chamber of claim 7, wherein the baseplate comprises an RF driven electrode.

11. The plasma chamber of claim 10, wherein the plasma reaction chamber comprises a parallel plate reactor having an upper electrode facing the baseplate.

12. The plasma chamber of claim 11, further comprising a substrate mounted on the substrate chuck such that the outer edge of the substrate overhangs the edge ring with a clearance gap of less than about 0.003 inch between the lower surface of the substrate and an upper surface of the edge ring.

13. A method of treating a semiconductor substrate in the plasma chamber of claim 7, said method comprising the steps of:
   electrostatically clamping a substrate to the substrate chuck;
   electrostatically clamping the edge ring to the edge ring chuck;
   supplying a process gas to the interior of the plasma chamber;
   energizing the process gas into a plasma state; and
   processing the substrate with the plasma.

14. The method of claim 13, further comprising controlling the temperature of the edge ring by supplying a heat transfer gas between opposed surfaces of the edge ring and the annular support.

15. The plasma chamber of claim 6, wherein the edge ring chuck comprises an outer portion of a ceramic body mounted on the substrate support, the ceramic body including an electrostatic substrate chuck located radially inward of the edge ring chuck.

16. The plasma chamber of claim 6, wherein the edge ring is adapted to be electrostatically clamped to the edge ring chuck.

17. The plasma chamber of claim 6, wherein the edge ring is comprised entirely of an electrically conductive material selected from silicon and silicon carbide.

18. The plasma chamber of claim 6, wherein the substrate support comprises a temperature controlled electrode adapted to maintain the edge ring below a threshold temperature by heat conduction from the edge ring to the substrate support.

19. The plasma chamber of claim 6, wherein the substrate support includes an annular flange and a coupling ring mounted on the annular flange, the edge ring chuck being located on an upper surface of the coupling ring, the edge ring being clamped on the coupling ring such that a recess in an upper surface of the edge ring is located beneath an outer periphery of a substrate mounted on the substrate support.

20. The plasma chamber of claim 6, wherein the plasma chamber is a semiconductor etching apparatus.

21. An edge ring clamping assembly adapted to surround a substrate support in a plasma reaction chamber, the edge ring clamping assembly comprising:
   a member having an annular support surface;
   an electrostatic edge ring chuck on the annular support surface;
   and an edge ring on the edge ring chuck, the edge ring being comprised entirely of an electrically conductive material and dimensioned so as to provide a clearance gap between a lower surface of a substrate located on the substrate support and an upper surface of the edge ring.

22. The edge ring clamping assembly of claim 21, wherein the edge ring consists essentially of an electrically conductive material selected from the group consisting of silicon, silicon carbide, single crystal silicon, polycrystalline silicon, and CVD silicon carbide.

23. An edge ring clamping assembly adapted to surround a substrate support in a plasma reaction chamber, the edge ring clamping assembly comprising:
   a member having an annular support surface; and
   an electrostatic edge ring chuck on the annular support surface, wherein the substrate support includes an annular flange and a coupling ring mounted on the annular flange, the edge ring chuck being located on an upper surface of the coupling ring, the edge ring being clamped on the edge ring chuck such that a recess in an upper surface of the edge ring is located beneath an outer periphery of a substrate mounted on the substrate support, the edge ring chuck and the edge ring being effective to provide a more uniform RF impedance path at the center and edge of the substrate.

* * * * *